United States Patent
Huckenbeck et al.

(10) Patent No.: US 9,761,767 B2
(45) Date of Patent: Sep. 12, 2017

(54) LIGHT SOURCE COMPRISING A LUMINESCENT SUBSTANCE AND ASSOCIATED ILLUMINATION UNIT

(75) Inventors: Barbara Huckenbeck, Augsburg (DE); Hailing Cui, Regensburg (DE); Frank Jermann, Koenigsbrunn (DE)

(73) Assignees: OSRAM OPTO SEMICONDUCTORS GMBH, Regensburg (DE); OSRAM GMBH, Munich (DE)

( * ) Notice: Subject to any disclaimer, the term of this patent is extended or adjusted under 35 U.S.C. 154(b) by 685 days.

(21) Appl. No.: 14/345,981

(22) PCT Filed: Sep. 5, 2012

(86) PCT No.: PCT/EP2012/067337
§ 371 (c)(1),
(2), (4) Date: Mar. 20, 2014

(87) PCT Pub. No.: WO2013/041377
PCT Pub. Date: Mar. 28, 2013

(65) Prior Publication Data
US 2014/0217454 A1   Aug. 7, 2014

(30) Foreign Application Priority Data
Sep. 23, 2011   (DE) .................... 20 2011 106 052 U

(51) Int. Cl.
*H01J 1/62* (2006.01)
*H01L 33/50* (2010.01)
(Continued)

(52) U.S. Cl.
CPC ........ *H01L 33/504* (2013.01); *C09K 11/0883* (2013.01); *C09K 11/7792* (2013.01);
(Continued)

(58) Field of Classification Search
CPC ...................................... H01L 33/502
(Continued)

(56) References Cited

U.S. PATENT DOCUMENTS

| | | |
|---|---|---|
| 7,485,243 B2 | 2/2009 | Hintzen et al. |
| 7,489,073 B2 | 2/2009 | Fiedler et al. |

(Continued)

FOREIGN PATENT DOCUMENTS

| | | |
|---|---|---|
| CN | 1596292 A | 3/2005 |
| CN | 101849256 A | 9/2010 |

(Continued)

OTHER PUBLICATIONS

Japanese Office Action based on application No. 2014-531165 (4 pages of English translation) dated Mar. 4, 2015.
(Continued)

*Primary Examiner* — Vip Patel
(74) *Attorney, Agent, or Firm* — Viering, Jentschura & Partner mbB

(57) ABSTRACT

A light source includes a primary radiation source, which emits radiation in the shortwave range of the optical spectral range, wherein this radiation is converted at least by means of a first luminescent substance entirely or partially into secondary longer-wave radiation in the visible spectral range, wherein the first luminescent substance originates from the class of nitridic modified orthosilicates (NOS), wherein the luminescent substance has as a component M predominantly the group EA=Sr, Ba, Ca, or Mg alone or in combination, wherein the activating dopant D is composed at least of Eu and replaces a proportion of M, and wherein a proportion of $SiO_2$ is introduced in deficiency, so that a modified sub-stoichiometric orthosilicate is provided, wherein the orthosilicate is an orthosilicate stabilized with RE and N, where RE=rare earth metal.

18 Claims, 13 Drawing Sheets

(51) Int. Cl.
*C09K 11/08* (2006.01)
*C09K 11/77* (2006.01)
*G02F 1/1335* (2006.01)

(52) U.S. Cl.
CPC ...... *H01L 33/502* (2013.01); *G02F 1/133603* (2013.01); *H01L 2224/32245* (2013.01); *H01L 2224/48091* (2013.01); *H01L 2224/48247* (2013.01); *H01L 2224/73265* (2013.01)

(58) Field of Classification Search
USPC .................................. 313/503, 501, 498
See application file for complete search history.

(56) References Cited

U.S. PATENT DOCUMENTS

| | | |
|---|---|---|
| 2006/0232193 A1 | 10/2006 | Fiedler et al. |
| 2008/0106186 A1 | 5/2008 | Ishii et al. |
| 2009/0117672 A1 | 5/2009 | Caruso et al. |
| 2009/0134414 A1 | 5/2009 | Li et al. |
| 2010/0207132 A1 | 8/2010 | Lee et al. |
| 2012/0207923 A1 | 8/2012 | Baumgartner |
| 2013/0140981 A1 | 6/2013 | Huber et al. |

FOREIGN PATENT DOCUMENTS

| | | |
|---|---|---|
| CN | 103097491 A | 5/2013 |
| DE | 102006016548 A1 | 10/2006 |
| DE | 60307411 T2 | 3/2007 |
| EP | 1980605 A2 | 10/2008 |
| JP | 2006299259 A | 11/2006 |
| JP | 2007027796 A | 2/2007 |
| JP | 2009521077 A | 5/2007 |
| JP | 2007137946 A | 6/2007 |
| JP | 2009040944 A | 2/2009 |
| JP | 2010225960 A | 10/2010 |
| WO | 2004029177 A1 | 4/2004 |
| WO | 2006068141 A1 | 6/2006 |
| WO | 2007071397 A1 | 6/2007 |
| WO | 2009045924 A1 | 4/2009 |
| WO | 2011045216 A1 | 4/2011 |
| WO | 2011160944 A1 | 12/2011 |

OTHER PUBLICATIONS

English abstract of DE 102006016548 A1 of Oct. 19, 2006.
English abstract of JP 2009040944 A of Feb. 26, 2009.
English abstract of JP 2007137946 A of Jun. 7, 2007.
International Search Report issued in the corresponding PCT application No. PCT/EP2012/067337 dated Nov. 29, 2012.
Search Report issued in the corresponding German application No. 202011106052.0 dated Mar. 1, 2012.

LIGHT SOURCE COMPRISING A LUMINESCENT SUBSTANCE AND ASSOCIATED ILLUMINATION UNIT

RELATED APPLICATIONS

The present application is a national stage entry according to 35 U.S.C. §371 of PCT application No.: PCT/EP2012/067337 filed on Sep. 5, 2012, which claims priority from German application No.: 20 2011 106 052.0 filed on Sep. 23, 2011, and is incorporated herein by reference in its entirety.

TECHNICAL FIELD

Various embodiments relate to a light source, in particular a conversion LED (light-emitting diode). Such conversion LEDs are suitable in particular for general illumination.

BACKGROUND

A conversion LED, which uses a modified regular orthosilicate as a luminescent substance, is known from U.S. Pat. No. 7,489,073.

Stable green luminescent substances, in particular having an emission maximum around 520-540 nm, are hardly available. This makes the use of conversion LEDs in display backlighting more difficult and restricts the optimization of high CRI LEDs or warm-white LEDs. Up to this point, primarily orthosilicates have been used in products as green luminescent substances for this range. These do sometimes have high quantum efficiencies, but display inadequate aging behavior in LEDs.

A nitrido-orthosilicate having the composition $AE_{2-x-a}RE_xEu_aSiO_{4-x}N_x$ (AE=Sr, Ba, Ca, Mg; RE=rare earths, in particular Y and/or La) is known from U.S. Pat. No. 7,489,073. EA or also AE stands for alkaline earth elements here. By incorporating YN and/or LaN, a red shift of the spectral location and typically an improvement of the quantum efficiency of the luminescent substance are achieved. The LED aging behavior of this luminescent substance is already significantly better using the production method described therein than in the case of the conventional orthosilicates or other green sion luminescent substances, for example, $Ba_3Si_6O_{12}N_2$:Eu.

For many applications, for example, for LCD backlighting, the stability in damp surroundings and at higher temperatures is still not optimal, however.

SUMMARY

Various embodiments provide a light source, which allows high efficiency and stability to be achieved. Various embodiments further provide a light source for LCD backlighting.

A novel nitridic luminescent substance is now provided according to the present disclosure. This includes blue or blue-green to yellow-emitting luminescent substances, which are excitable in particular in the emission range of typical UV and blue LEDs and simultaneously have a very high stability in the LED. The luminescent substances can be used in particular in LEDs having good color reproduction, in LEDs for LCD backlighting, color on-demand LEDs, or white OLEDs. Usage in laser-activated remote phosphor devices (LARP) or LED remote phosphor devices is also possible.

White semiconductor-based light sources, such as LED, LARP, and LERP are gaining more and more significance in particular in LCD backlighting. In particular, the demand is increasing for warm-white LEDs having low color temperatures and good color reproduction and simultaneously high efficiency.

The luminescent substances must meet an array of requirements: a very high stability with respect to chemical influences, for example, oxygen, moisture, interactions with casting materials, and with respect to radiation. To ensure a stable colorimetric locus in the event of rising system temperature, luminescent substances which have a low temperature quenching behavior are additionally necessary.

Such luminescent substances are used in white LEDs and color on-demand LEDs.

The excitation of such luminescent substances is preferably performed using shortwave radiation in the UV and shortwave blue range, in particular in the range of 360 to 480 nm.

The present disclosure is based on the provision of luminescent substances from the material classes of the nitrido-orthosilicates.

It has been shown that a deficiency of $SiO_2$ in these luminescent substances results in higher quantum efficiencies.

Therefore, a composition results of the batch mixture for the stabilized nitrido-orthosilicate of $AE_{2-x-a}RE_xEu_aSi_{1-y}O_{4-x-2y}N_x$ (AE=Sr, Ba, Ca, Mg; RE=rare earth metals, selected from the group La, Lu, Dy, Yb alone or in combination), wherein x is preferably between 0.002 and 0.02, and a is preferably between 0.01 and 0.2. The factor y, which is decisive for the $SiO_2$ deficiency, is in the range between $0<y\leq0.1$, preferably in the range from $0.002\leq y\leq0.02$. In the method described here for producing a stabilized nitrido-orthosilicate, in one embodiment, the educt side is preferably additionally expanded by $Si_3N_4$ and $RE_2O_3$.

For the preparation of $AE_{2-x-a}RE_xEu_aSi_{1-y}O_{4-x-2y}N_x$, one requires either $AECO_3$, $SiO_2$, REN, and $Eu_2O_3$ or $AECO_3$, $SiO_2$, $Si_3N_4$, $RE_2O_3$, and $Eu_2O_3$ as starting substances. Furthermore, in particular fluorides and chlorides, such as $AECl_2$, $AEF_2$, but also $NH_4Cl/NH_4F$, $H_3BO_3$, LiF, and cryolites, and also combinations thereof, can be used as fluxes.

Surprisingly, it has been shown that a luminescent substance of the type stabilized nitrido-orthosilicate having very special RE selected from the group La, Lu, Dy, Yb alone or in combination fulfill the properties, which are particularly critical for semiconductor light sources, of good efficiency during high-current operation and stable aging behavior in an optimized manner. This applies in particular for the requirements in light sources for LCD backlighting. Another requirement is the stability under irradiation using lasers as a primary light source.

LCD backlighting is gaining more and more significance in many industrial segments. In particular, the demand is rising for flat constructions of the backlighting. It can currently only be satisfied by means of semiconductor light sources such as LED backlighting. In addition, the requirements on the components with respect to color reproduction, service life, and efficiency are continuously rising simultaneously.

To be able to produce, for example, a white LED for the backlighting, which has a sufficiently large color space, it is necessary to use sufficiently narrowband green and red luminescent substances.

The luminescent substances must meet an array of requirements, to ensure a long service life and high efficiency: a very high stability with respect to chemical influences, for example, oxygen, moisture, interactions with casting materials, and with respect to radiation. To ensure a stable colorimetric locus in the event of rising system temperature, luminescent substances, which have a low temperature quenching behavior at the operating temperature of the LED, are additionally necessary. In particular green narrowband luminescent substances, which have a sufficient chemical stability, are presently not commercially available on the market.

Previous LEDs for backlighting have typically been achieved either by:
1. a combination of a relatively long-wave LED with a yellow luminescent substance,
2. a combination of blue LED with broadband green luminescent substances and red luminescent substances, or
3. a combination of blue LED with a narrowband green luminescent substance, preferably an orthosilicate, and a red luminescent substance.

The first solution is efficient, but only a very small color space can be covered. The second solution can also only be used for a narrow RGB color space due to the broadband green emission. The third solution is suitable in principle for an NTSC color space >85%, but as a result of the green luminescent substance used (orthosilicate), displays strong LED appearances of aging and therefore also efficiency losses and colorimetric locus shifts, since orthosilicates are not sufficiently chemically stable. The abbreviation NTSC (national television system committee) relates to a high-quality television standard.

The solution according to the present disclosure is suitable for the first time for sufficiently stable and efficient backlighting, which spans a sufficiently large NTSC color space (≥85%). It consists of the combination of a blue-emitting LED with a novel narrowband yellow-green-emitting nitrido-orthosilicate luminescent substance of the form $AE_{2-x-a}RE_xEu_aSiO_4N_x$ or in particular a specially stabilized, sub-stoichiometric nitrido-orthosilicate of the form $AE_{2-x-a}RE_xEu_aSi_{1-y}O_{4-x-2y}N_x$ and a narrowband red nitrido-aluminosilicate luminescent substance of the form $AEAlSiN_3:Eu^{2+}$.

Both luminescent substance types are similarly stable and similarly efficient, so that undesired colorimetric locus shifts do not occur. This development represents a milestone with respect to semiconductor-based light sources, in particular for use for the backlighting of NTSC-capable devices.

In this context, above all RE=Lu, Dy, Yb have proven themselves, alone or in combination, since they can provide the required high-current efficiency.

A particularly preferred light source uses a modified orthosilicate, which has a grain size $d_{50}$ in the range of 10 to 30 µm. This relatively coarse grain has proven to be particularly efficient in comparison to finer grain, because of lesser scattering properties and the very good absorption connected thereto in the range of the excitation light source. A further advantageous parameter of the modified orthosilicate is the value $b_{80}$, which is to lie in the range ≤1.5, to ensure a narrow grain size distribution, which also improves the efficiency and the scattering behavior. By way of a small value b80=(d90−d10)/d50, i.e., very narrow grain distributions, the scattering resulting therefrom is kept nearly constant. This is important, for example, for the colorimetric locus control in an LED. In the case of very broad grain distributions having b80 greater than 1.5, the scattering varies greatly, depending on the grain size proportions, and therefore the colorimetric loci resulting therefrom also differ.

The sub-stoichiometric orthosilicate, which is stabilized with RE, has proven to be particularly preferable. The proportion of $SiO_2$ is particularly critical here. The long-term stability of the light source, which uses the REN-stabilized orthosilicate, is improved by at least 20% or up to well over 50%, depending on the extent of the deviation from the stoichiometry. The proportion y of the RE in relation to M is preferably to be in the range from 0.2 to 5%, depending on the field of application, this proportion may also be selected to be even higher, but is not to exceed 10%. Good results are achieved with y=0.25 to 1%.

The luminescent substance of the modified orthosilicate type is preferably embedded in cast resin and applied to an LED, or connected upstream from an LED or also a laser diode as a ceramic (LERP and LARP application).

If cast resin is used, it can be applied to the LED by means of chip level conversion, sedimentation, or volume casting. A filler material is preferably used at a proportion of 1 to 50 wt.-% of the cast resin. The filler material is preferably $SiO_2$, in particular having a grain size d50 between 3 and 7 µm. Further components are silicone in particular.

The luminescent substance is green-emitting and has the formula $AE_{(2-x-y)}RE_xEu_ySiO_{(4-x)}N_x$ or $AE_{(2-x-y)}RE_xEu_ySi_{(1-s)}O_{(4-2s-x)}N_x$. AE is Ba, Sr, Ca alone or in combination, RE is Lu, La, Dy, Yb alone or in combination, wherein 0<x<0.1 and also 0<y<0.2. The particular value of such luminescent substances is that they emit in a very narrow band, so that they can replace the competing, but very complex solution using three color-emitting LEDs of the type RGB. Fundamentally, only very few luminescent substances are sufficiently narrowband to be suitable for these requirements, and additionally to be suitable in the strongly loaded environment of a semiconductor light source as a primary light source. Such luminescent substances are also referred to hereafter as NOS, nitrido-orthosilicates, wherein the modification with rare earths RE based on a nitride additive REN is expressed as doping using the rare earth RE, for example, NOS:RE.

A preferred additional red-emitting luminescent substance is calsin:Eu, in particular this is a modified luminescent substance having the restriction AE(1−z)EuzAiSiN(3−0.67t) Ot, wherein 0<z<0.1 and 0<t<0.1 with AE=Ca, Sr alone or in combination. The special value of this combination is that these luminescent substances emit in a similarly narrow band as the novel green-emitting luminescent substance. A technical solution for LCD backlighting is therefore available, which can replace the very complex solution using three color-emitting LEDs of the type RGB. Fundamentally, only very few luminescent substances are sufficiently narrowband to be suitable for these requirements, and additionally to be suitable in the strongly loaded environment of a semiconductor light source as a primary light source. Narrowband means here that both luminescent substances, the green-emitting and the red-emitting, have an FWHM (full width at half maximum) of at most 95 nm.

The special challenge in the case of LCD solutions is the adaptation to the green and red color filter used. Typical green-emitting luminescent substances, which are used here, have a peak emission at 540 nm and are not very flexible. It is therefore difficult to thus achieve a high color gamut, because the typical color filters are adapted to a green maximum of 515 to 535 nm. If typical orthosilicates are used, the peak emission can be intentionally moved into this window range, but color shifts soon occur as a result of the high operating temperatures and the color homogeneity is lacking.

An illumination unit according to the present disclosure contains, in addition to the light source, at least one color filter having a maximum in the range of 625 to 655 nm. A second color filter is preferably used for the green range having a maximum between 515 and 535 nm. In particular, a solution having three color filters is preferred, a blue color filter having a maximum between 435 and 455 nm, a green color filter having a maximum between 515 and 535 nm, and a red color filter having a maximum of 625 to 655 nm.

The novel green-emitting luminescent substance of the type modified orthosilicate is substantially better adapted and in particular is sufficiently narrowband here. The FWHM of the novel luminescent substance is typically from 60 to 90 nm, similarly as that also displayed by a matching calsin luminescent substance. The peak of the emission of the modified luminescent substance may be set variably to 515 to 535 nm by suitable composition, whereby it is optimally adapted to typical color filters. The combination of suitable blue semiconductor primary light source, LED or laser diode, having peak emission of 430 to 460 nm, with partial conversion of the primary light by a modified green-emitting nitrido-orthosilicate having peak emission in the range of 510 to 540 nm and having partial conversion of the primary light by a red-emitting luminescent substance, AEAlSiN$_3$:Eu, possibly modified, displays a high color gamut and a high level of brightness, also if the typical color filters are used. The efficiency remains consistently high over the service life.

A suitable filler material, which is used together with these luminescent substances in the cast resin, is SiO$_2$, which is nearly transparent to light, with respect to room temperature. One alternative is Al$_2$O$_3$. Therefore, no brightness losses occur at room temperature. At higher operating temperatures, an index of refraction difference results between the filler material and the cast resin, whereby the scattering is amplified. Color shifts are thus minimized and the color homogeneity is improved when the operating temperature is reached.

Instead of cast resin, another medium such as silicone or glass can also be used. The luminescent substance or the mixture can optionally also be applied directly to the chip or spaced apart therefrom, for example, in a plate made of glass or ceramic.

Depending on the selected color space and the applied color filter, other rare earth elements can also be used or can be used as an admixture to Yb, Dy, La, or Lu. This applies above all for Ho, Er, and Tm.

Depending on the application, other activation metals can also be used in addition to Eu. Preferred alternatives are Ce or Mn.

These can also be used in particular as a co-dopant in addition to Eu. In general, the proportion thereof is then preferably at most 30% on the activator D in addition to Eu.

While NOS:La is extraordinarily chemically stable, the efficiency thereof decreases in the case of very high forward currents in an LED. The higher the ambient temperature, surprisingly, the less this disadvantageous effect will become. In contrast, NOS:Lu, NOS:Yb, and NOS:Dy display somewhat less chemical stability, but very good consistency of the efficiency in the case of high forward currents.

The stabilizing effect of the REN already occurs at small concentrations of 0.025% of the NOS:RE, this stabilization effect is maintained at least up to a concentration of 0.25% of the NOS:RE.

Preferred concentrations of the activation are 2 to 10% with respect to M, which is substantially AE and RE.

A light source is disclosed having a primary radiation source, which emits radiation in the shortwave range of the optical spectral range in the wavelength range of 420 to 480 nm, wherein this radiation is converted at least by means of a first luminescent substance entirely or partially into secondary longer-wave radiation in the visible spectral range, wherein the first luminescent substance originates from the class of nitridic modified orthosilicates (NOS), which is derived from the structure M$_2$SiO$_4$:D, characterized in that the luminescent substance has as a component M predominantly the group EA=Sr, Ba, Ca, or Mg alone or in combination, wherein the activating dopant D is composed at least of Eu and replaces a proportion of M, and wherein a proportion of SiO$_2$ is introduced in deficiency, so that a modified sub-stoichiometric orthosilicate is provided, wherein the orthosilicate is an orthosilicate stabilized with RE and N, where RE=rare earth metal, so that the batch stoichiometry corresponds to the formula EA$_{2-x-a}$RE$_x$Eu$_a$Si$_{1-y}$O$_{4-x-2y}$N$_x$, wherein RE=La or Lu or Dy or Yb alone or in combination, and wherein the full width at half maximum FWHM of the NOS is at most 90 nm.

In a further embodiment, the light source is configured such that the proportion a of the Eu is between a=0.01 and 0.20.

In a still further embodiment, EA contains Sr and/or Ba with at least 66 mol-%, in particular with a proportion of the Ca of at most 5 mol-% and in particular with a proportion of the Mg of at most 30 mol-%, wherein EA is preferably a mixture of Sr and Ba, Sr/Ba=0.3 to 2.3, is preferably a mixture of Sr and Ba with Sr/Ba=0.8 to 1.2, and is particularly preferably a mixture of Sr and Ba with Sr/Ba=0.9 to 1.1.

In a still further embodiment, the proportion x is between 0.002 and 0.02.

In a still further embodiment, the factor y, which is decisive for the deficiency, is in the range of 0<y≤0.1, preferably between 0.002≤y≤0.02.

In a still further embodiment, the primary radiation source emits radiation in the blue in the wavelength range of 440 to 470 nm, wherein this radiation is partially converted by means of the first luminescent substance into secondary green radiation in the visible spectral range, in particular having peak emission in the range of 510 to 540 nm.

In a still further embodiment, a light-emitting diode based on InGaN or InGaAlP is used as the primary radiation source.

In a still further embodiment, a part of the primary radiation is furthermore converted by means of further luminescent substances into longer-wave radiation, wherein at least one luminescent substance has an FWHM of at most 90 nm.

In a still further embodiment, a second luminescent substance is connected upstream from the light source, which emits in red and in particular originates from the class AlSiN$_3$:Eu, where AE=Ca and/or Sr, alone or in combination.

A conversion LED is disclosed having a chip which emits primary radiation, and a layer containing at least one luminescent substance, which is connected upstream from the chip, and which converts at least a part of the primary radiation of the chip into secondary radiation, which originates from the class of nitridic modified orthosilicates (NOS), which is derived from the structure M$_2$SiO$_4$:D, characterized in that the luminescent substance has as a component M predominantly the group EA=Sr, Ba, Ca, or Mg alone or in combination, wherein the activating dopant D is composed at least of Eu and replaces a proportion of M, and wherein SiO$_2$ is introduced in deficiency, so that a modified sub-stoichiometric orthosilicate is provided, wherein the orthosilicate is an orthosilicate stabilized with RE and N, where RE=rare earth metal, so that the batch stoichiometry corresponds to the formula $EA_{2-x-a}RE_x Eu_aSi_{1-y}O_{4-x-2y}N_x$, wherein RE=La or Lu or Dy or Yb alone or in combination, and wherein the full width at half maximum FWHM of the NOS is at most 90 nm.

In a further embodiment, the conversion LED is configured such that a modified $CaAlSiN_3$:Eu is used as a further luminescent substance.

In a still further embodiment, the layer containing the luminescent substance is cast resin, silicone, or glass.

In a still further embodiment, the layer containing the luminescent substance is cast resin, wherein $SiO_2$ is used as a further filler.

An illumination unit for LCD backlighting is disclosed, wherein a light source or a conversion LED is used together with at least one, in particular two, preferably three color filters, wherein light source and color filter are adapted to one another such that a predefined color space is covered by at least 85%, wherein the color space is in particular NTSC.

An illumination unit for LCD backlighting is disclosed, wherein a light source or a conversion LED is used together with at least one color filter for the red spectral range having a maximum in the range of 625 to 655 nm, preferably together with a color filter for the green spectral range having a maximum in the range of 515 to 535 nm, particularly preferably together with a filter for the blue spectral range having a maximum between 435-455 nm.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

The following detailed description refers to the accompanying drawing that show, by way of illustration, specific details and embodiments in which the disclosure may be practiced.

Figure 1:
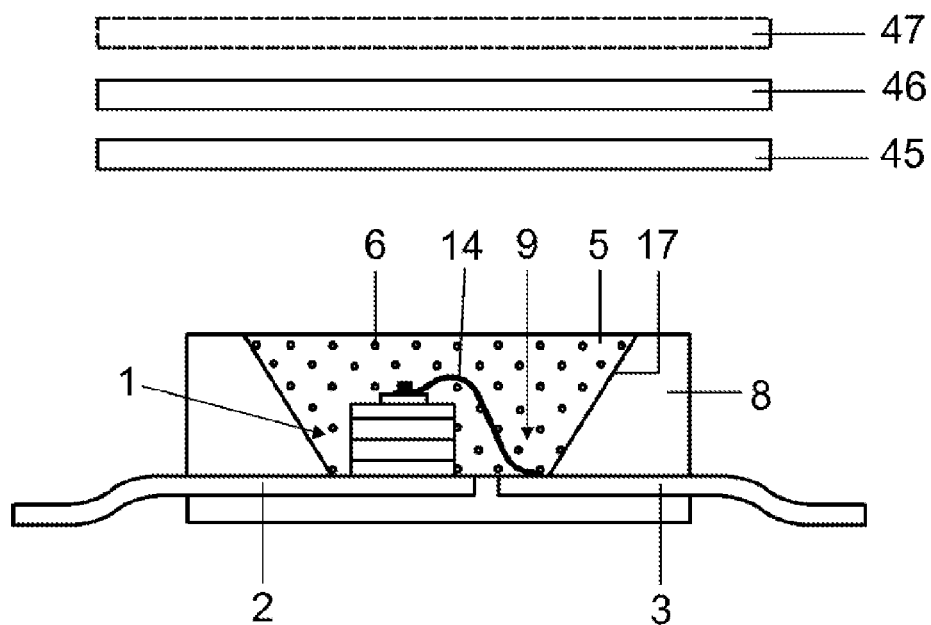
FIG. 1 shows a conversion LED.

FIG. 1 shows the construction of a conversion LED for white light on an RGB basis as known per se. The light source is a semiconductor component having a blue-emitting chip 1 of the type InGaN having a peak emission wavelength of 435 to 455 nm peak wavelength, for example, 445 nm, which is embedded in a light-opaque main housing 8 in the region of a recess 9. The chip 1 is connected via a bond wire 14 to a first terminal 3 and directly to a second electrical terminal 2. The recess 9 is filled with a casting compound 5, which contains as the main components a silicone (60-90 wt.-%) and luminescent substances 6 (approximately 15 to 40 wt.-%). A first luminescent substance is a green-emitting nitrido-orthosilicate luminescent substance $AE_{2-x-a}RE_x Eu_aSi_{1-y}O_{4-x-2y}N_x$, where AE is Ba, Sr and RE is Lu. Other exemplary embodiments use at least one of the following elements: for AE=Ba, Sr, Ca, Mg and for RE=Dy, Yb, La. In addition, a red-emitting luminescent substance, for example, an aluminum nitrido-silicate or calsin is used as a second luminescent substance. The recess has a wall 17, which is used as a reflector for the primary and secondary radiation from the chip 1 or the luminescent substance 6. Specific exemplary embodiments for further luminescent substances are, for generating white, a $CaAlSiN_3$:Eu modified by copper or oxygen or a (Ca, Sr) $AlSiN_3$:Eu.

In principle, the use of the luminescent substance mixture as a dispersion, as a thin film, etc., directly on the LED or also, as is known per se, on a separate carrier connected upstream from the LED is possible.

An illumination unit furthermore also comprises a green color filter 45, a red color filter 46, and optionally a blue color filter 47, which are mounted upstream from the LED.

Figure 2:
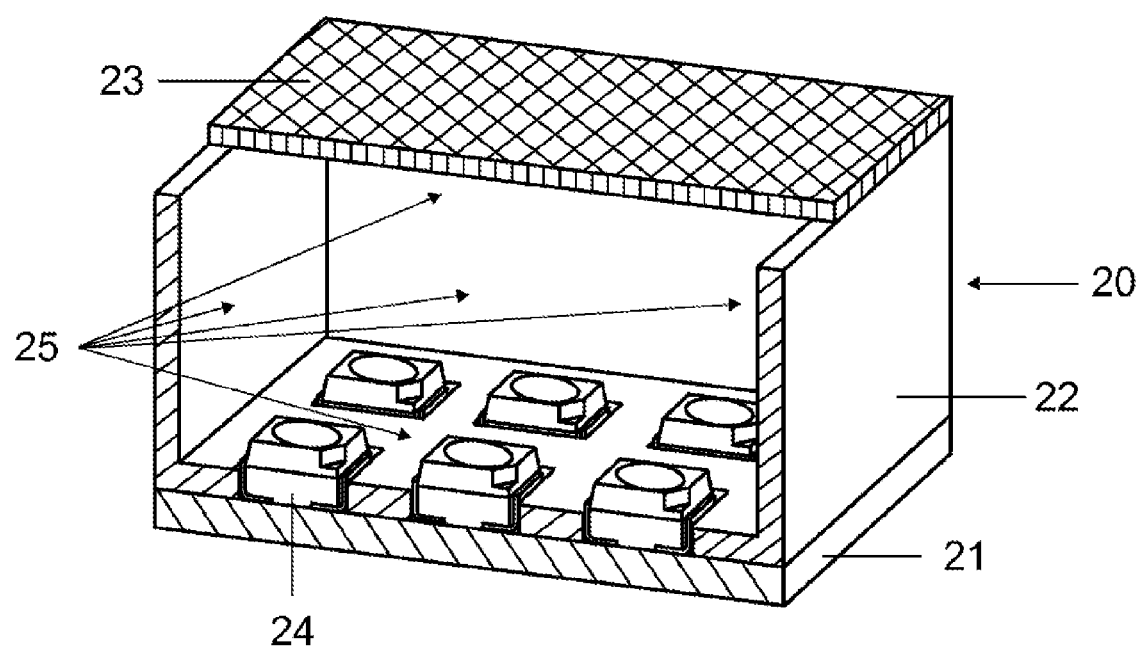
FIG. 2 shows an LED module having remotely applied luminescent substance mixture.

FIG. 2 shows such a module 20 having diverse LEDs 24 on a base plate 21. A housing is installed over them, having side walls 22 and a cover plate 23. The luminescent substance mixture is applied here as a layer 25 to both the side walls and also above all to the cover plate 23, which is transparent.

Other suitable light sources are luminescent substance lamps or high-pressure discharge lamps, in which the novel luminescent substance can be used for conversion of the primary radiation, alone or in combination with other luminescent substances. These luminescent substances are typically applied to the wall of a bulb of the lamp.

Figure 3:
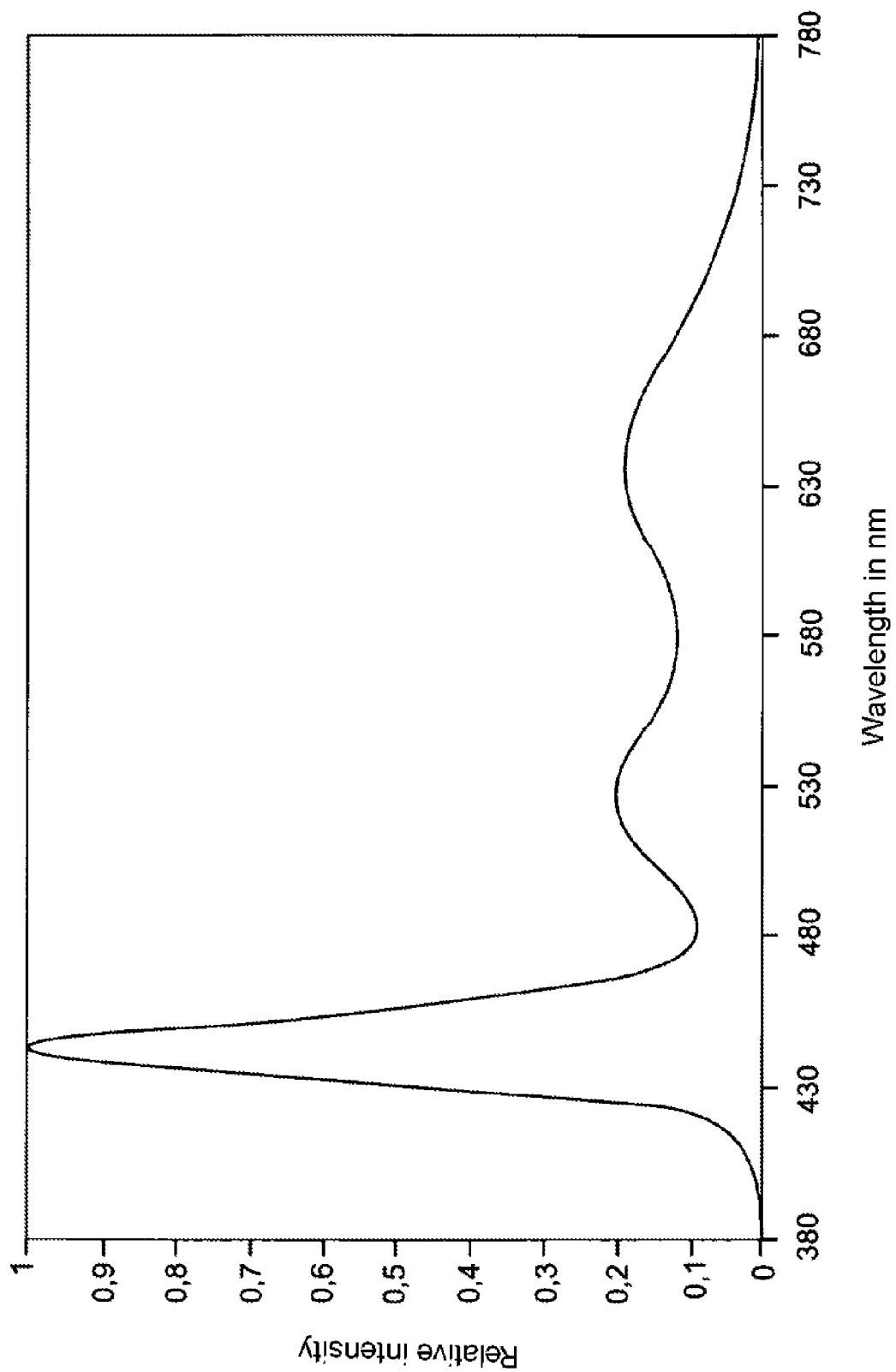
FIG. 3 shows an emission spectrum of an LCD backlight LED having a mixture of a green luminescent substance of the type $(Sr, Ba)_2Si_{1-y}O_{4-x-2y}N_x$:Eu, Lu and a red luminescent substance of the type aluminum nitrido-silicate $CaAlSiN_3$:$Eu^{2+}$.

FIG. 3 shows the spectrum of a converted LCD backlight LED on the basis of two luminescent substances. The excitation is performed by a primary emitting LED having 448 nm peak wavelength (blue). The wavelength is plotted in nanometers on the abscissa and the relative emission intensity is plotted on the ordinate. A first introduced luminescent substance is a red luminescent substance of the type $CaAlSiN_3$:Eu, the second is a green luminescent substance according to the present disclosure having the batch stoichiometry $(Ba, Sr)_{2-x-a}Lu_xEu_aSi_{1-y}O_{4-x-2y}N_x$, where x=0.005, a=0.08, and y=0.0075.

The production of the novel sub-stoichiometric luminescent substance is performed in the following manner:

The educts analogous to the batch mixtures 1 to 4 are weighed and homogenized, preferably together with a suitable flux. Subsequently, the educt mixture is annealed for several hours under reducing atmosphere (in particular under $N_2$ or Ar or a mixture of $N_2/H_2$ or $Ar/H_2$) at temperatures between 1000° C. and 1500° C. A secondary annealing can then be performed, also under reducing atmosphere (in particular under $N_2$ or Ar or a mixture of $N_2/H_2$ or $Ar/H_2$) at temperatures between 800° C. and 1400° C. The synthesis is carried out in a suitable furnace, e.g., tube furnaces or chamber furnaces.

a) comparative example/batch mixture 1 (prior art):
73.5 g $SrCO_3$, 98.1 g $BaCO_3$, 31.1 g $SiO_2$, and 7.2 g $Eu_2O_3$;

b) comparative example/batch mixture 2 (prior art):
73.3 g $SrCO_3$, 97.9 g $BaCO_3$, 31.1 g $SiO_2$, 0.4 g LaN, and 7.2 g $Eu_2O_3$;

c) embodiment/batch mixture 3:
73.4 g $SrCO_3$, 98.0 g $BaCO_3$, 30.8 g $SiO_2$, 0.1 g $Si_3N_4$, 0.4 g $La_2O_3$, and 7.2 g $Eu_2O_3$;

d) embodiment/batch mixture 4:
73.3 g $SrCO_3$, 98.0 g $BaCO_3$, 30.9 g $SiO_2$, 0.4 g LaN, and 7.2 g $Eu_2O_3$.

A significant improvement of the LED stability can already be recognized at higher temperatures and in a damp environment due to the incorporation of lanthanum and nitrogen in comparative example 2. For many applications, for example, for LCD backlighting, this stability is still not always optimal, however.

Figure 5:
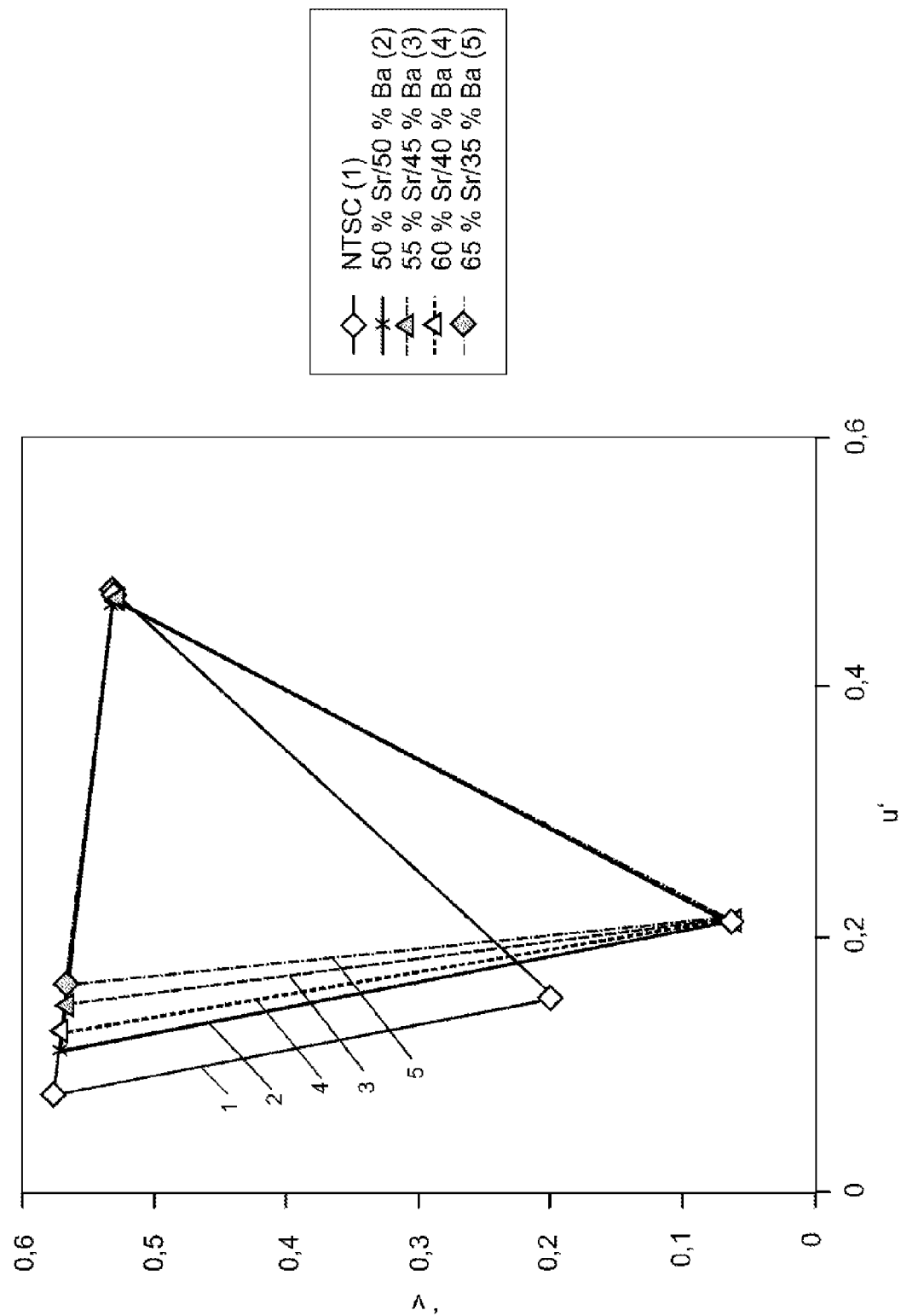
FIG. 5 shows a comparison of the color space spanned by various doped LEDs in relation to the color space NTSC.

The novel batch stoichiometry described here according to exemplary embodiment 3 or 4 having a corresponding deficiency of $SiO_2$ has been proven to result in improved LED stability, above all in a damp environment and at higher temperatures. FIG. 5 shows the LED stability at a temperature of 45° C. and 95% ambient humidity for the four different batch mixtures. The relative conversion ratio is plotted as the ordinate, and the abscissa is the time in minutes. It is shown that embodiments 3 and 4 are approximately equivalent to one another and both are markedly superior to comparative examples 1 and 2.

The relative quantum efficiencies $QE_{460}$ of the novel luminescent substances according to embodiments 3 and 4 upon excitation at 460 nm is 3% higher than in comparative example 2. The preparation of the described nitrido-orthosilicates of the form $AE_{2-x-a}RE_xEu_aSi_{1-y}O_{4-x-2y}N_x$ is typically performed from $AECO_3$, $SiO_2$, REN, and $Eu_2O_3$ or $AECO_3$, $SiO_2$, $Si_3N_4$, $(RE)_2O_3$, and $Eu_2O_3$ as starting substances. In the latter, the rare earths are used as $(RE)_2O_3$, if trivalent oxides are preferably formed. In the case of rare earth oxides which are preferably provided as mixed oxides, for example, Tb is typically provided as a III/IV mixed oxide $Tb_4O_7$, the mixed oxides are preferably used. Furthermore, instead of REN or RE oxide in conjunction with $Si_3N_4$, In, Y, or Sc can also be used as a nitride or as a combination of oxide and $Si_3N_4$.

Furthermore, in particular fluorides and chlorides, such as $AECl_2$ or $RECL_2$, $AEF_2$ or $RECL_2$, but also $NH_4Cl/NH_4F$, $H_3BO_3$, LiF, and cryolites, and also combinations thereof, can be used as fluxes.

The educts analogous to the batch mixtures 1 to are weighed and homogenized, together with a suitable flux. Subsequently, the educt mixture is annealed for several hours under reducing atmosphere (e.g. under $N_2$ or Ar or a mixture of $N_2/H_2$ or $Ar/H_2$) at temperatures between 1000° C. and 1500° C. A secondary annealing can then be performed, also under reducing atmosphere (e.g. under $N_2$ or Ar or a mixture of $N_2/H_2$ or $Ar/H_2$) at temperatures between 800° C. and 1400° C. The synthesis is carried out in a suitable furnace, e.g., tube furnaces or chamber furnaces.

Batch mixture 1:
69.9 g $SrCO_3$, 93.3 g $BaCO_3$, 29.3 g $SiO_2$, 0.1 g $Si_3N_4$, 0.5 g $La_2O_3$, and 7.0 g $Eu_2O_3$ Batch mixture 2:
69.9 g $SrCO_3$, 93.3 g $BaCO_3$, 29.3 g $SiO_2$, 0.1 g $Si_3N_4$, 0.4 g $Pr_6O_{11}$, and 7.0 g $Eu_2O_3$ Batch mixture 3:
69.9 g $SrCO_3$, 93.3 g $BaCO_3$, 29.3 g $SiO_2$, 0.1 g $Si_3N_4$, 0.4 g $Nd_2O_3$, and 7.0 g $Eu_2O_3$ Batch mixture 4:
69.9 g $SrCO_3$, 93.3 g $BaCO_3$, 29.3 g $SiO_2$, 0.1 g $Si_3N_4$, 0.4 g $Sm_2O_3$, and 7.0 g $Eu_2O_3$ Batch mixture 5:
69.9 g $SrCO_3$, 93.3 g $BaCO_3$, 29.3 g $SiO_2$, 0.1 g $Si_3N_4$, 0.4 g $Gd_2O_3$, and 7.0 g $Eu_2O_3$ Batch mixture 6:
69.9 g $SrCO_3$, 93.3 g $BaCO_3$, 29.3 g $SiO_2$, 0.1 g $Si_3N_4$, 0.5 g $Tb_4O_7$, and 7.0 g $Eu_2O_3$ Batch mixture 7:
69.9 g $SrCO_3$, 93.3 g $BaCO_3$, 29.3 g $SiO_2$, 0.1 g $Si_3N_4$, 0.5 g $Dy_2O_3$, and 7.0 g $Eu_2O_3$ Batch mixture 8:
69.9 g $SrCO_3$, 93.3 g $BaCO_3$, 29.3 g $SiO_2$, 0.1 g $Si_3N_4$, 0.5 g $Ho_2O_3$, and 7.0 g $Eu_2O_3$ Batch mixture 9:
69.9 g $SrCO_3$, 93.3 g $BaCO_3$, 29.3 g $SiO_2$, 0.1 g $Si_3N_4$, 0.5 g $Er_2O_3$, and 7.0 g $Eu_2O_3$ Batch mixture 10:
69.9 g $SrCO_3$, 93.3 g $BaCO_3$, 29.3 g $SiO_2$, 0.1 g $Si_3N_4$, 0.5 g $Tm_2O_3$, and 7.0 g $Eu_2O_3$ Batch mixture 11:
69.9 g $SrCO_3$, 93.3 g $BaCO_3$, 29.3 g $SiO_2$, 0.1 g $Si_3N_4$, 0.5 g $Yb_2O_3$, and 7.0 g $Eu_2O_3$ Batch mixture 12:
69.9 g $SrCO_3$, 93.3 g $BaCO_3$, 29.3 g $SiO_2$, 0.1 g $Si_3N_4$, 0.5 g $Lu_2O_3$, and 7.0 g $Eu_2O_3$ Batch mixture 13:
69.9 g $SrCO_3$, 93.3 g $BaCO_3$, 29.3 g $SiO_2$, 0.1 g $Si_3N_4$, 0.4 g $Y_2O_3$, and 7.0 g $Eu_2O_3$ Batch mixture 14:
69.9 g $SrCO_3$, 93.3 g $BaCO_3$, 29.3 g $SiO_2$, 0.1 g $Si_3N_4$, 0.2 g $Sc_2O_3$, and 7.0 g $Eu_2O_3$ Batch mixture 15:
69.9 g $SrCO_3$, 93.3 g $BaCO_3$, 29.3 g $SiO_2$, 0.1 g $Si_3N_4$, 0.4 g $In_2O_3$, and 7.0 g $Eu_2O_3$ A comparison of the spectral properties is shown in following Table 1 based on the example of a La/N doping with and without $SiO_2$ deficiency.

TABLE 1

| Composition | $\lambda_{exc.}$ [nm] | x | y | $\lambda_{dom}$ [nm] | FWHM [nm] | QE [%] |
|---|---|---|---|---|---|---|
| $(Ba_{0.9575}Sr_{0.9575}La_{0.005}Eu_{0.08})SiO_{3.995}N_{0.005}$ | 460 | 0.285 | 0.638 | 545.9 | 64.2 | 87 |
| $(Ba_{0.9575}Sr_{0.9575}La_{0.005}Eu_{0.08})$ v | 460 | 0.285 | 0.639 | 545.9 | 64.1 | 100 |

The spectral data of further embodiments are listed in following Table 2.

TABLE 2

| Composition | $\lambda_{exc.}$ [nm] | x | y | $\lambda_{dom}$ [nm] | FWHM [nm] | QE [%] |
|---|---|---|---|---|---|---|
| $(Ba_{0.9575}Sr_{0.9575}La_{0.005}Eu_{0.08})\ Si_{0.9925}O_{3.9875}N_{0.005}$ | 60 | 285 | 639 | 5.9 | 4.1 | 1.00 |
| $(Ba_{0.9575}Sr_{0.9575}Pr_{0.005}Eu_{0.08})\ Si_{0.9925}O_{3.9875}N_{0.005}$ | 60 | 288 | 636 | 6.4 | 4.4 | 0.95 |
| $(Ba_{0.9575}Sr_{0.9575}Sm_{0.005}Eu_{0.08})\ Si_{0.9925}O_{3.9875}N_{0.005}$ | 60 | 285 | 638 | 5.9 | 5.0 | 0.89 |
| $(Ba_{0.9575}Sr_{0.9575}Gd_{0.005}Eu_{0.08})\ Si_{0.9925}O_{3.9875}N_{0.005}$ | 60 | 286 | 637 | 6.1 | 5.4 | 0.97 |
| $(Ba_{0.9575}Sr_{0.9575}Tb_{0.005}Eu_{0.08})\ Si_{0.9925}O_{3.9875}N_{0.005}$ | 60 | 290 | 637 | 6.9 | 5.2 | 1.02 |
| $(Ba_{0.9575}Sr_{0.9575}Dy_{0.005}Eu_{0.08})\ Si_{0.9925}O_{3.9875}N_{0.005}$ | 60 | 289 | 637 | 6.7 | 5.1 | 1.00 |
| $(Ba_{0.9575}Sr_{0.9575}Ho_{0.005}Eu_{0.08})\ Si_{0.9925}O_{3.9875}N_{0.005}$ | 60 | 292 | 635 | 7.2 | 5.7 | 0.98 |
| $(Ba_{0.9575}Sr_{0.9575}Er_{0.005}Eu_{0.08})\ Si_{0.9925}O_{3.9875}N_{0.005}$ | 60 | 297 | 632 | 8.1 | 6.5 | 0.97 |
| $(Ba_{0.9575}Sr_{0.9575}Tm_{0.005}Eu_{0.08})\ Si_{0.9925}O_{3.9875}N_{0.005}$ | 60 | 297 | 634 | 8.2 | 6.4 | 1.00 |
| $(Ba_{0.9575}Sr_{0.9575}Yb_{0.005}Eu_{0.08})\ Si_{0.9925}O_{3.9875}N_{0.005}$ | 60 | 298 | 633 | 8.3 | 7.1 | 0.98 |
| $(Ba_{0.9575}Sr_{0.9575}Lu_{0.005}Eu_{0.08})\ Si_{0.9925}O_{3.9875}N_{0.005}$ | 60 | 298 | 632 | 8.3 | 7.2 | 1.01 |
| $(Ba_{0.9575}Sr_{0.9575}Y_{0.005}Eu_{0.08})\ Si_{0.9925}O_{3.9875}N_{0.005}$ | 60 | 294 | 635 | 7.6 | 5.5 | 1.02 |
| $(Ba_{0.9575}Sr_{0.9575}In_{0.005}Eu_{0.08})\ Si_{0.9925}O_{3.9875}N_{0.005}$ | 60 | 301 | 630 | 8.8 | 8.0 | 0.99 |
| $(Ba_{0.9575}Sr_{0.9575}Sc_{0.005}Eu_{0.08})\ Si_{0.9925}O_{3.9875}N_{0.005}$ | 60 | 296 | 633 | 8.0 | 6.9 | 1.00 |

Figure 4:
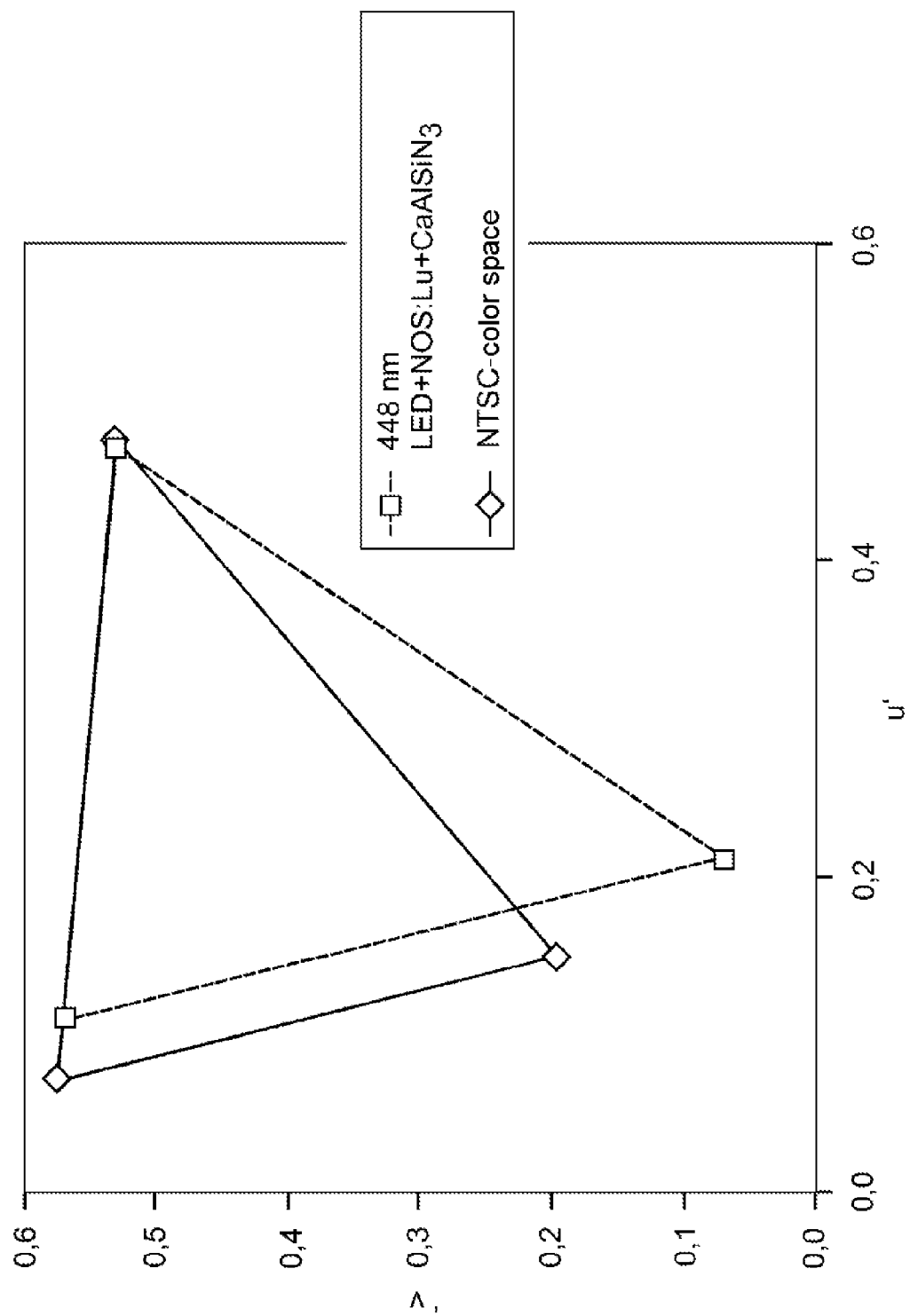
FIG. 4 shows a comparison of the color space NTSC and the color space spanned by an LED according to FIG. 3.

An embodiment of a white LED (according to the construction from FIG. 2) with the associated color space in comparison to the NTSC color space is shown in FIG. 4. The blue component is provided here by the primary radiation having the peak emission wavelength 448 nm of the LED, the green component is the secondary radiation, based on a modified nitrido-orthosilicate of the form $(Ba_{0.9575}Sr_{0.9575}Lu_{0.005}Eu_{0.08})\ Si_{0.9925}O_{3.98}N_{0.005}$, the red component is the secondary radiation, based on a red nitrido-aluminosilicate of the form $CaAlSiN_3:Eu^{2+}$. The associated spectrum is shown in FIG. 3.

To be able to span a sufficiently large NTSC color space ≥85%, it is necessary to adapt the colorimetric locus of the luminescent substances by way of a suitable AE-RE ratio. This good adaptability is a particular advantage of the stabilized NOS. The dependence of the colorimetric locus on the relative Ba/Sr content in the stabilized nitrido-orthosilicate is described hereafter according to FIG. 3 as an example, wherein the color coordinates u' and v' are plotted as the abscissa and ordinate. This is accompanied by the influencing of the size of the NTSC color space, see FIG. 5. The largest color space is achieved here with a relative ratio Sr/Ba of 1:1 (curve (2)), and a ratio 1.1:0.9 according to curve (3) still displays acceptable results.

The novel green nitrido-orthosilicate luminescent substance generally displays a higher chemical stability than conventional green orthosilicates, wherein the extent of the stabilization and the efficiency of the luminescent substance in the case of low and high currents are dependent on the "doping" with REN. Doping here means addition in small quantities.

Figure 6:
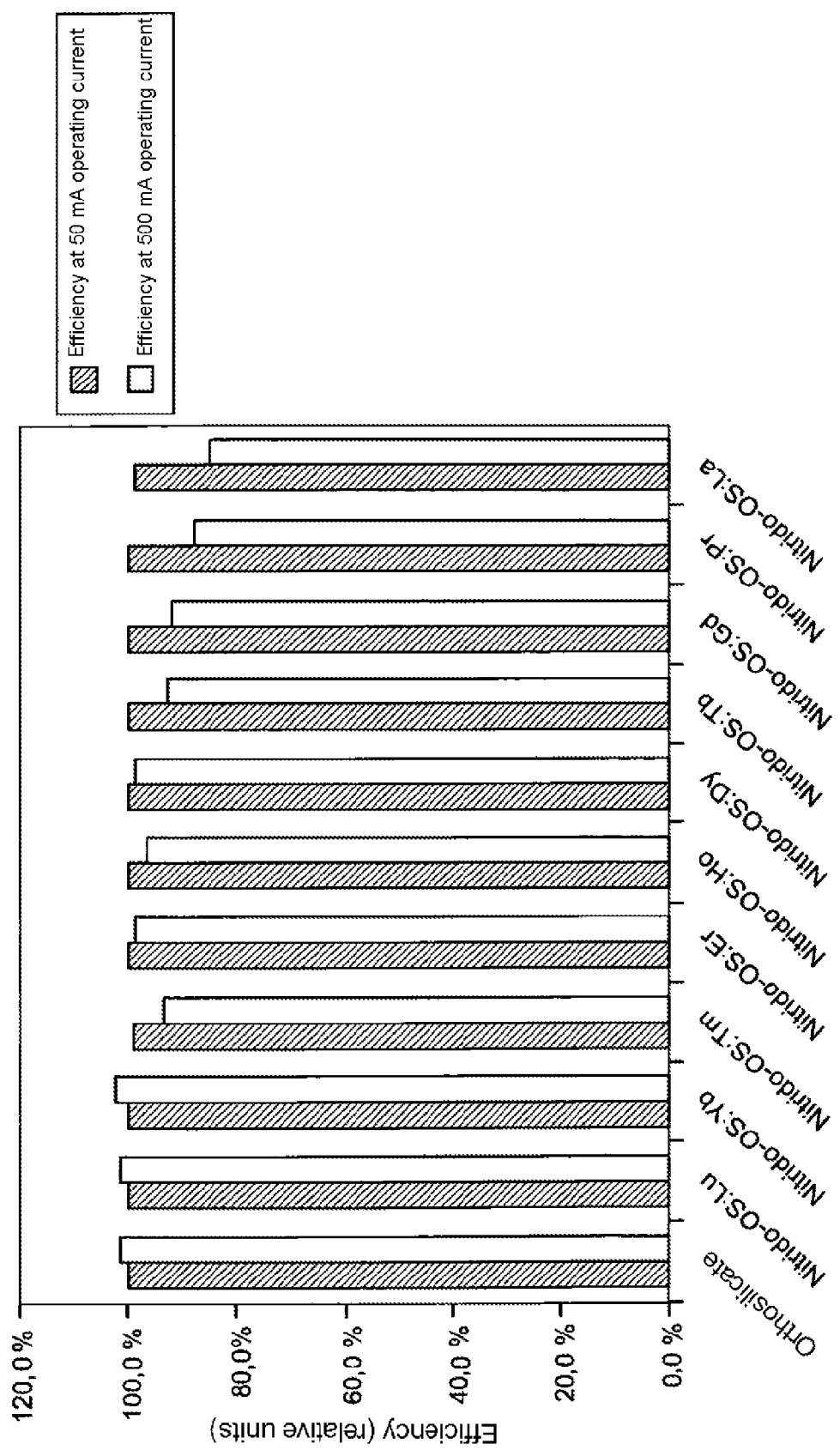
FIG. 6 shows the efficiency of various luminescent substances in the operation of an LED under low current and high current conditions.

Embodiments of the nitrido-orthosilicate of the form $(Ba_{0.9575}Sr_{0.9575}RE_{0.005}Eu_{0.08})Si_{0.9925}O_{3.98}N_{0.005}$ for high-current efficiency or low-current efficiency are shown in FIG. 6. High-current operation typically means 500 mA, more generally at least 200 mA up to 700 mA. Low-current operation typically means 50 mA, more generally 30 mA up to 150 mA. Lu and Yb show the best results as RE doping here. The comparative example orthosilicate means $BaSr-SiO_4:Eu$ as an orthosilicate without REN doping, the other luminescent substance is a luminescent substance stabilized with REN of the same type, wherein RE respectively denotes the specified element. An addition of Lu and Yb are at least equal to the pure orthosilicate in high-current suitability, with the additional advantage of colorimetric locus adaptation.

The preparation of the described nitrido-orthosilicates of the form $AE_{2-x-a}RE_xEu_aSiO_4N_x$, see also U.S. Pat. No. 7,489,073, or $AE_{2-x-a}RE_xEu_aSi_{1-y}O_{4-x-2y}N_x$, is typically performed from $AECO_3$, $SiO_2$, REN, and $Eu_2O_3$ or $AECO_3$, $SiO_2$, $Si_3N_4$, $(RE)_2O_3$, and $Eu_2O_3$ as starting substances. In the latter, the rare earths are used as $(RE)_2O_3$, if trivalent oxides are preferably formed. In the case of rare earth oxides which are preferably provided as mixed oxides, for example, Tb is typically provided as a III/IV mixed oxide $Tb_4O_7$, the mixed oxides are preferably used.

Furthermore, in particular fluorides and chlorides, such as $AECl_2$ or $RECl_2$, $AEF_2$ or $RECl_2$, but also $NH_4Cl/NH_4F$, $H_3BO_3$, LiF, and cryolites, and also combinations thereof, can be used as fluxes.

The educts analogous to the batch mixtures 1 to 12 are weighed and homogenized, together with a suitable flux. Subsequently, the educt mixture is annealed for several hours under reducing atmosphere (e.g. under $N_2$ or Ar or a mixture of $N_2/H_2$ or $Ar/H_2$) at temperatures between 1000° C. and 1500° C. A secondary annealing can then be performed, also under reducing atmosphere (e.g. under $N_2$ or Ar or a mixture of $N_2/H_2$ or $Ar/H_2$) at temperatures between 800° C. and 1400° C. The synthesis is carried out in a suitable furnace, e.g., tube furnaces or chamber furnaces.

Batch mixture 1:
69.9 g $SrCO_3$, 93.3 g $BaCO_3$, 29.3 g $SiO_2$, 0.1 g $Si_3N_4$, 0.5 g $La_2O_3$, and 7.0 g $Eu_2O_3$ Batch mixture 2:
69.9 g $SrCO_3$, 93.3 g $BaCO_3$, 29.3 g $SiO_2$, 0.1 g $Si_3N_4$, 0.4 g $Pr_6O_{11}$, and 7.0 g $Eu_2O_3$ Batch mixture 3:
69.9 g $SrCO_3$, 93.3 g $BaCO_3$, 29.3 g $SiO_2$, 0.1 g $Si_3N_4$, 0.4 g $Nd_2O_3$, and 7.0 g $Eu_2O_3$ Batch mixture 4:
69.9 g $SrCO_3$, 93.3 g $BaCO_3$, 29.3 g $SiO_2$, 0.1 g $Si_3N_4$, 0.4 g $Sm_2O_3$, and 7.0 g $Eu_2O_3$ Batch mixture 5:
69.9 g $SrCO_3$, 93.3 g $BaCO_3$, 29.3 g $SiO_2$, 0.1 g $Si_3N_4$, 0.4 g $Gd_2O_3$, and 7.0 g $Eu_2O_3$ Batch mixture 6:
69.9 g $SrCO_3$, 93.3 g $BaCO_3$, 29.3 g $SiO_2$, 0.1 g $Si_3N_4$, 0.5 g $Tb_4O_7$, and 7.0 g $Eu_2O_3$ Batch mixture 7:
69.9 g $SrCO_3$, 93.3 g $BaCO_3$, 29.3 g $SiO_2$, 0.1 g $Si_3N_4$, 0.5 g $Dy_2O_3$, and 7.0 g $Eu_2O_3$ Batch mixture 8:
69.9 g $SrCO_3$, 93.3 g $BaCO_3$, 29.3 g $SiO_2$, 0.1 g $Si_3N_4$, 0.5 g $Ho_2O_3$, and 7.0 g $Eu_2O_3$ Batch mixture 9:
69.9 g $SrCO_3$, 93.3 g $BaCO_3$, 29.3 g $SiO_2$, 0.1 g $Si_3N_4$, 0.5 g $Er_2O_3$, and 7.0 g $Eu_2O_3$
Batch mixture 10:
69.9 g $SrCO_3$, 93.3 g $BaCO_3$, 29.3 g $SiO_2$, 0.1 g $Si_3N_4$, 0.5 g $Tm_2O_3$, and 7.0 g $Eu_2O_3$
Batch mixture 11:
69.9 g $SrCO_3$, 93.3 g $BaCO_3$, 29.3 g $SiO_2$, 0.1 g $Si_3N_4$, 0.5 g $Yb_2O_3$, and 7.0 g $Eu_2O_3$
Batch mixture 12:
69.9 g $SrCO_3$, 93.3 g $BaCO_3$, 29.3 g $SiO_2$, 0.1 g $Si_3N_4$, 0.5 g $Lu_2O_3$, and 7.0 g $Eu_2O_3$ In this case, three variants of the nitrido-orthosilicate luminescent substance of the form $AE_{2-x-a}RE_xEu_aSi_{1-y}O_{4-x-2y}N_x$ are preferred because of the behavior thereof upon the combined observation of aging stability and efficiency. Both aspects are equally significant for an illumination unit for LCD backlighting.

Figure 7:
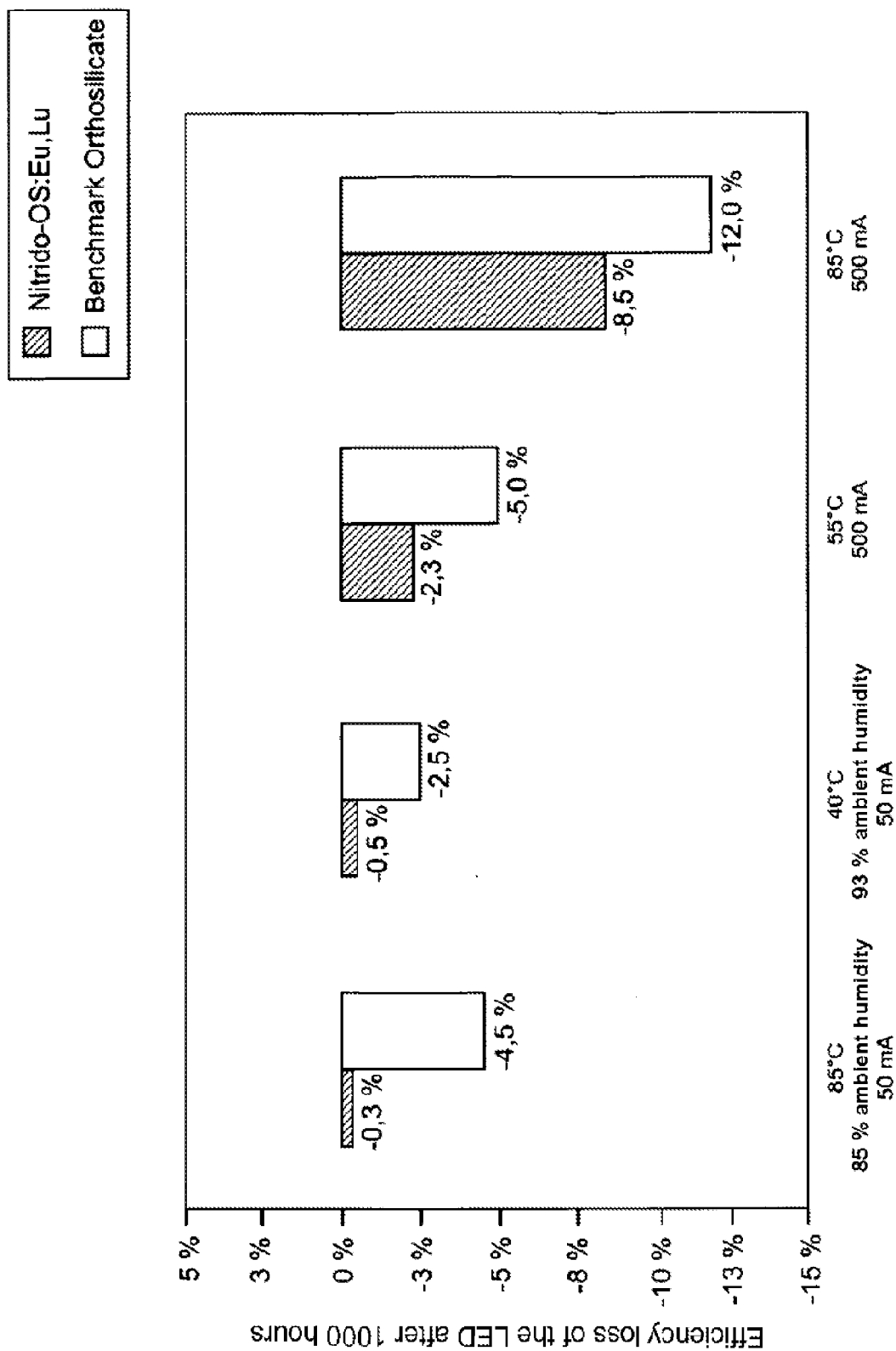
FIG. 7 shows the efficiency loss after 1000 hours of a Lu-doped NOS under harsh conditions, which require chemical stability.

1. A nitrido-orthosilicate of the embodiment $AE_{2-x-a}Lu_xEu_aSi_{1-y}O_{4-x-2y}N_x$, which has a higher chemical stability in comparison to commercial orthosilicates, see FIG. 7 in this regard, and displays comparable efficiency both in the case of low currents and also in the case of high LED currents, see FIG. 6 in this regard. Normal orthosilicate without REN but of otherwise identical composition is selected as a benchmark. The described NOS: Lu is $(Ba_{0.9575}Sr_{0.9575}Lu_{0.005}Eu_{0.08})Si_{0.9925}O_{3.98}N_{0.005}$ under blue primary excitation at 447 nm.

Figure 8:
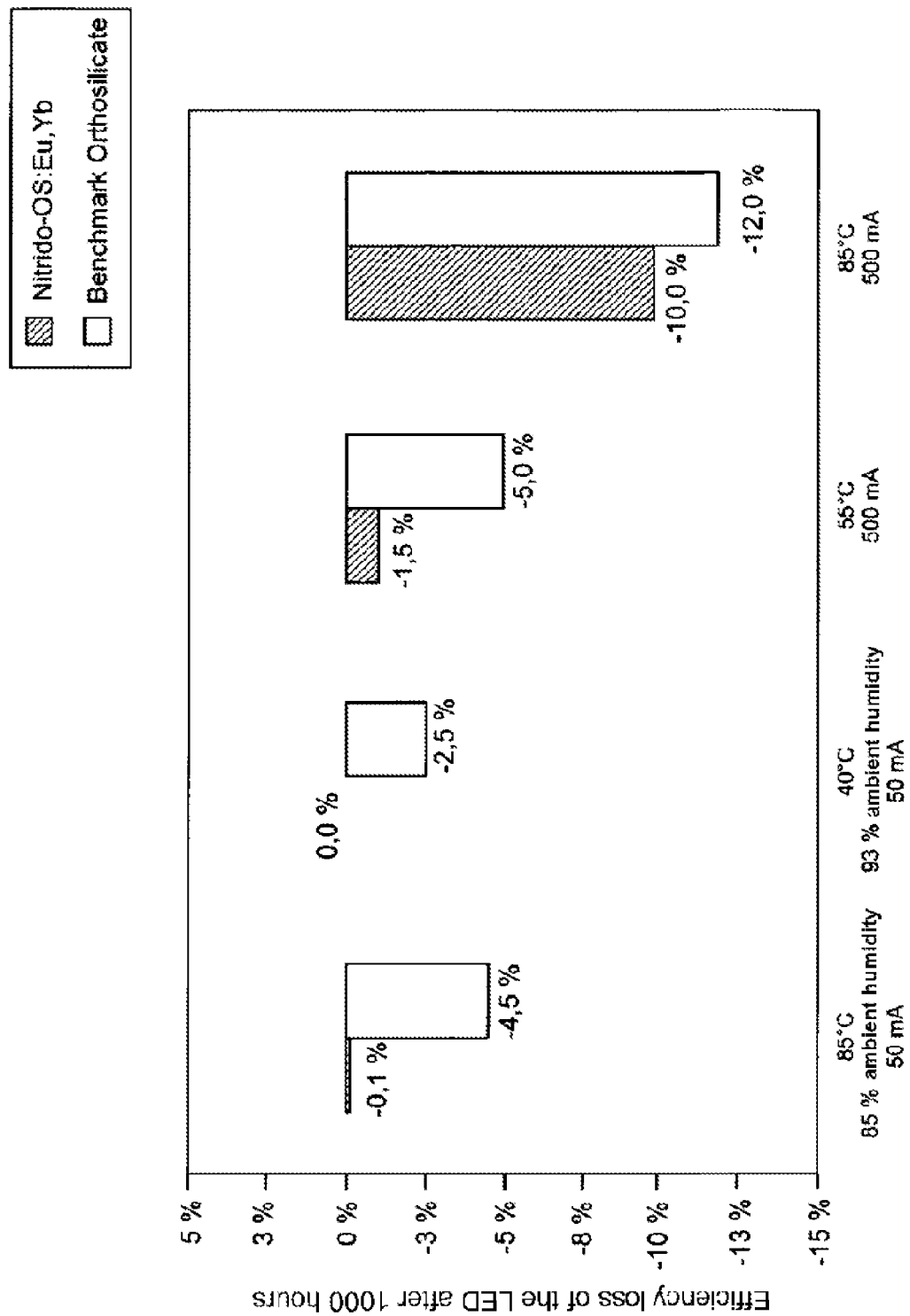
FIG. 8 shows the efficiency loss after 1000 hours of an Yb-doped NOS under harsh conditions, which require chemical stability.

2. A nitrido-orthosilicate of the embodiment $AE_{2-x-a}Yb_xEu_aSi_{1-y}O_{4-x-2y}N_x$, which has a higher chemical stability in the LED in comparison to commercial orthosilicates, see FIG. 8 in this regard, and displays comparable efficiency both in the case of low currents and also in the case of high LED currents, see FIG. 6 in this regard. The described NOS:Yb is $(Ba_{0.9575}Sr_{0.9575}Yb_{0.005}Eu_{0.08})Si_{0.9925}O_{3.98}N_{0.005}$ under blue primary excitation at 448 nm.

Figure 9:
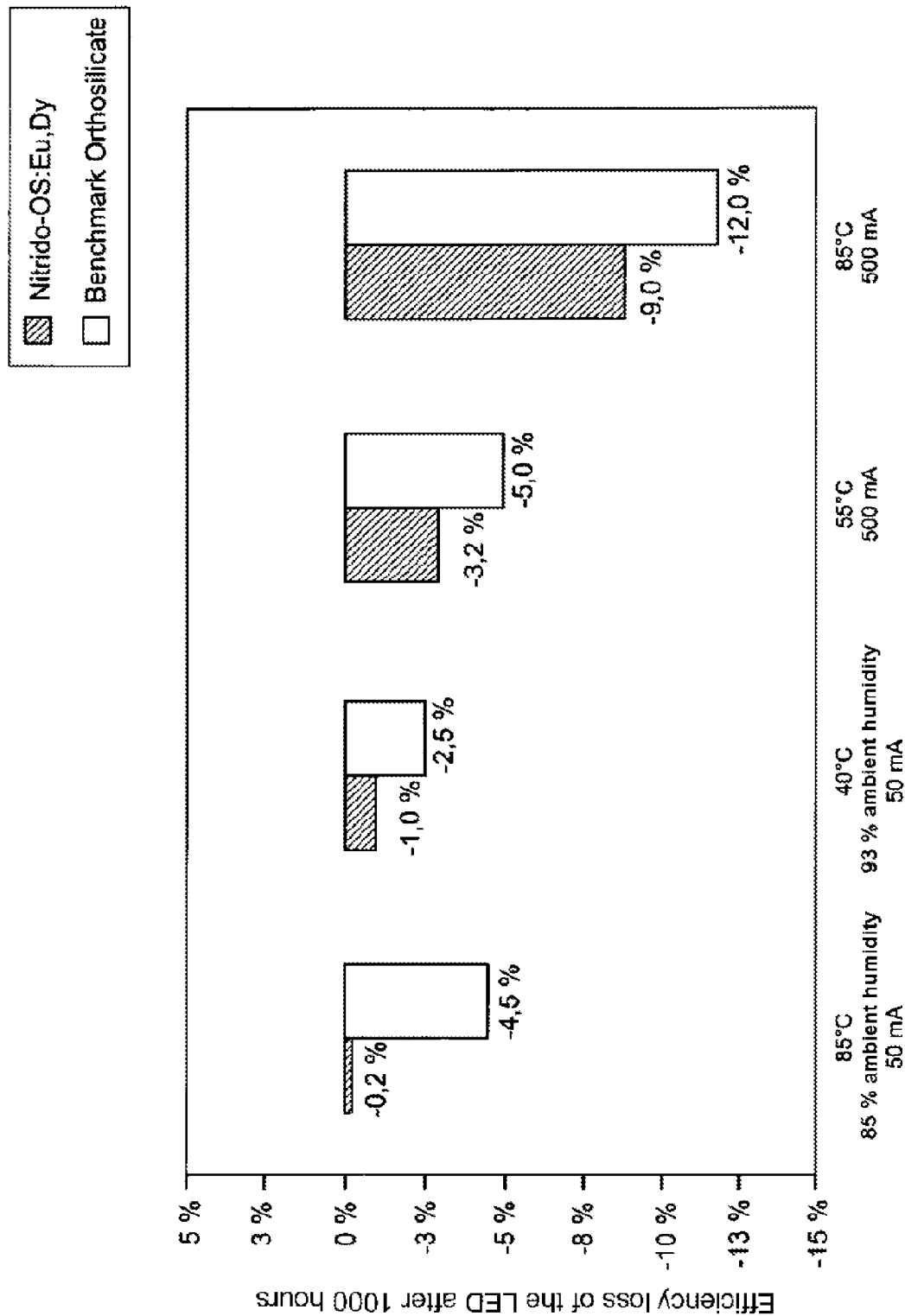
FIG. 9 shows the efficiency loss after 1000 hours of a Dy-doped NOS under harsh conditions, which require chemical stability.

3. A nitrido-orthosilicate of the embodiment $AE_{2-x-a}Dy_xEu_aSi_{1-y}O_{4-x-2y}N_x$, which has a higher chemical stability in the LED in comparison to commercial orthosilicates, see FIG. 9 in this regard, and displays comparable efficiency in the case of low currents and nearly comparable efficiency in the case of high LED currents, see FIG. 6 in this regard. The described NOS: Dy is $(Ba_{0.9575}Sr_{0.9575}Dy_{0.005}Eu_{0.08})Si_{0.9925}O_{3.98}N_{0.005}$ under blue primary excitation at 447 nm.

The properties of the above-described luminescent substance combinations permit the implementation of coverage of at least 85% of the NTSC color space with very good aging stability and efficiency.

Figure 10:
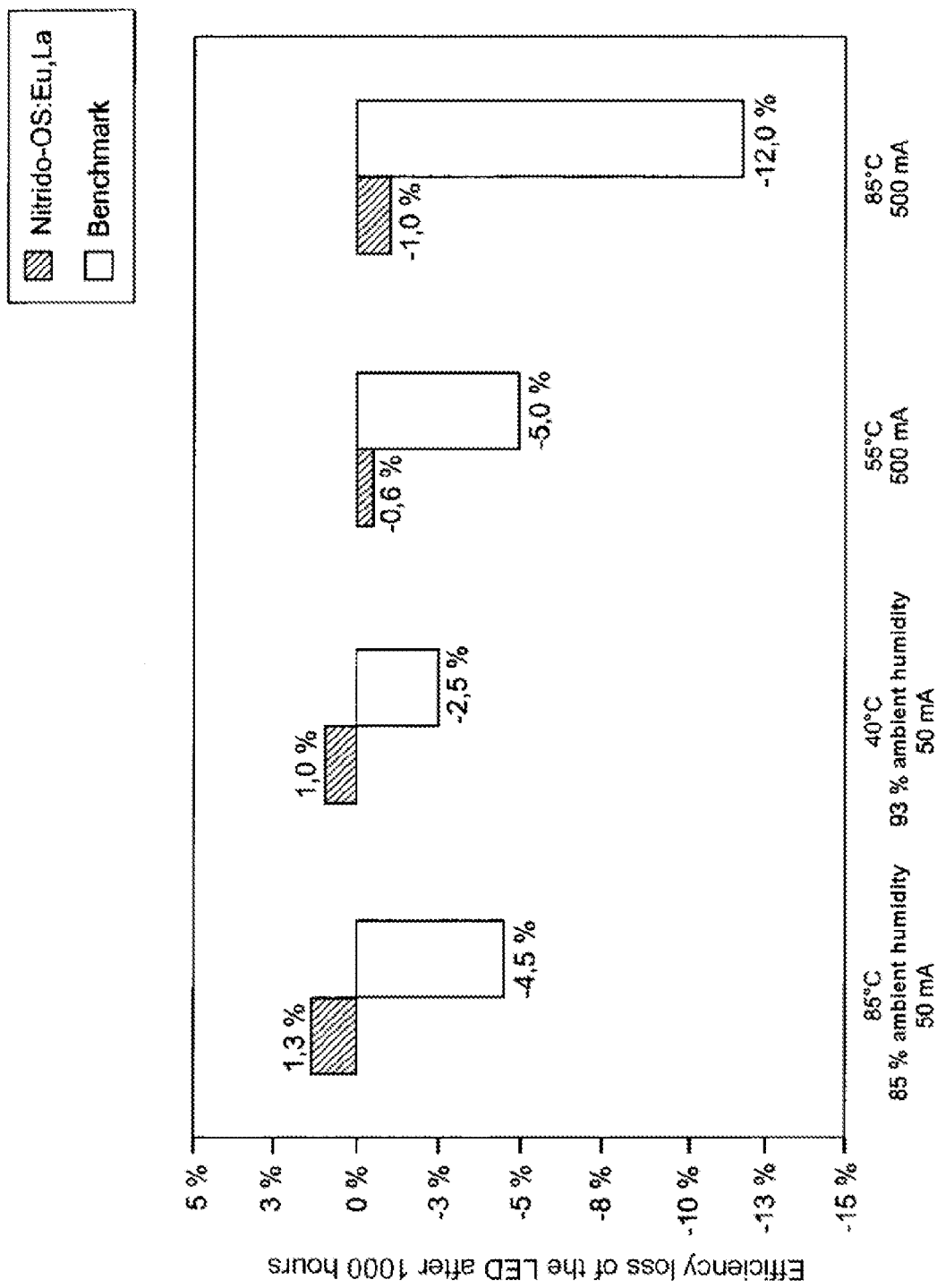
FIG. 10 shows the efficiency loss after 1000 hours of a La-doped NOS under harsh conditions, which require chemical stability.
Figure 11:
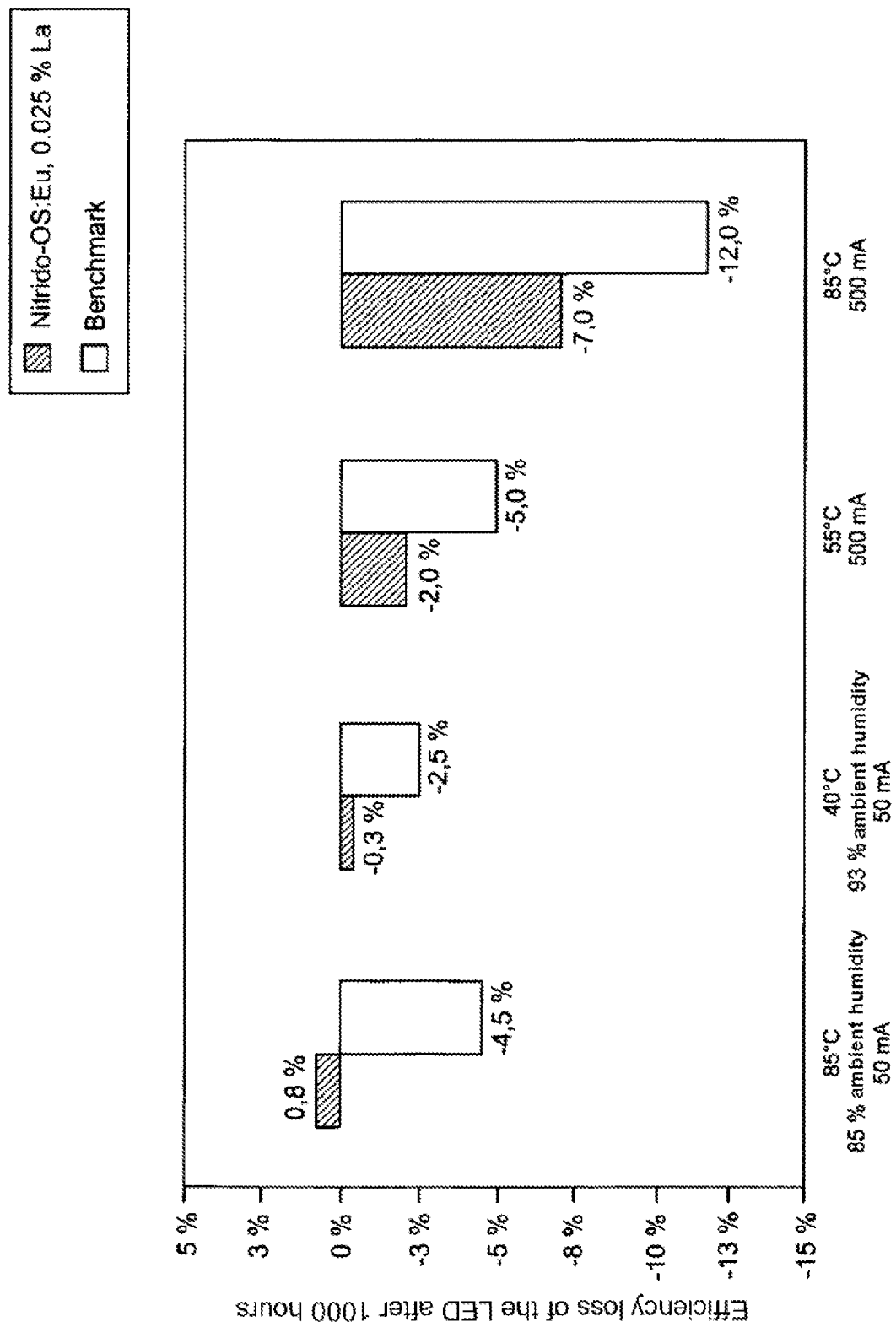
FIG. 11 shows the efficiency loss after 1000 hours of a slightly La-doped NOS under harsh conditions, which require chemical stability.

For applications which place high chemical stability claims, a nitrido-orthosilicate of the embodiment $AE_{2-x-a}La_xEu_aSi_{1-y}O_{4-x-2y}N_x$, which has an extremely high chemical stability in the LED in comparison to commercial orthosilicates, can be used, see FIG. 10 and FIG. 11 for various proportions of La, with comparable efficiency in the case of low operating currents, see FIG. 6. The described NOS:La shown in FIG. 10 is $(Ba_{0.9575}Sr_{0.9575}La_{0.005}Eu_{0.08})Si_{0.9925}O_{3.98}N_{0.005}$ under blue primary excitation at 447 nm. The La proportion is 0.0025 in FIG. 11.

Figure 12:
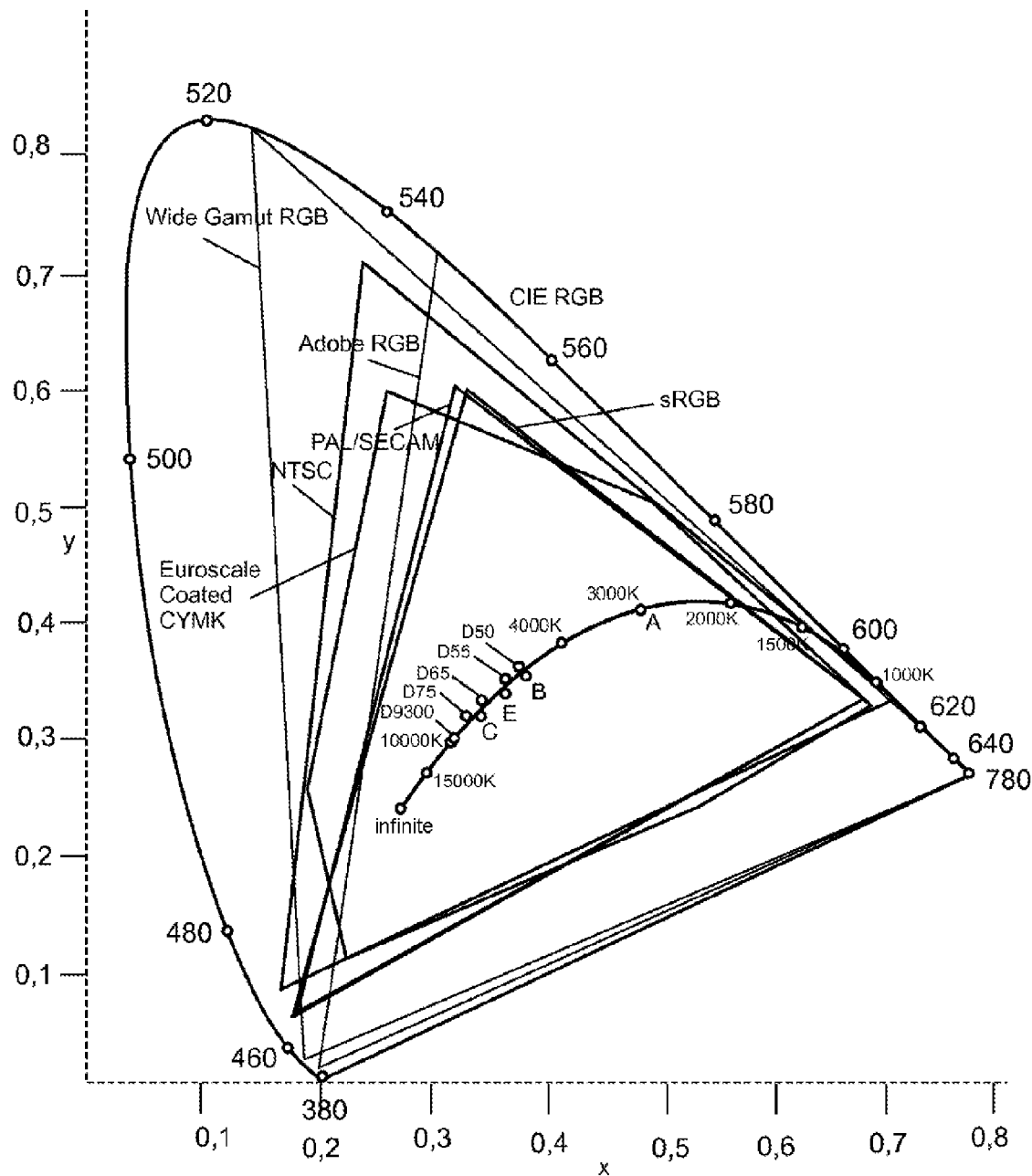
FIG. 12 shows the illustration of various color spaces with incorporation of NTSC.

Finally, FIG. 12 shows a comparison of the various currently used color spaces. NTSC is one of the largest defined color spaces overall. It is correspondingly difficult to represent using technical solutions. The greater the overlap with this color space by a technical solution, the more colors can thus be displayed on a television, for example.

The term 85% NTSC means that using a corresponding light source, specifically a combination of LED (blue) and two luminescent substances (red and green), after filtering by the red and green color filters, 85% of the area of this color space can be covered. For such a large color space, unusually narrowband luminescent substances are necessary, which preferably only have an FWHM of 70 nm or less. Therefore, for the implementation of the NTSC color space, most luminescent substances cannot be used, in particular, for example, no garnets or modified garnets. One example is the possible use of LuAGaG:Ce, which, as a result of its non-narrowband nature, can only be used for the very much smaller color space sRGB (shown in FIG. 12), but certainly not for the NTSC color space.

Surprisingly, the reliable implementation has heretofore only been successful using selected modified nitrido-orthosilicates, if RE is selected to be Lu, Dy, La, or Yb or a combination thereof.

Figure 13:
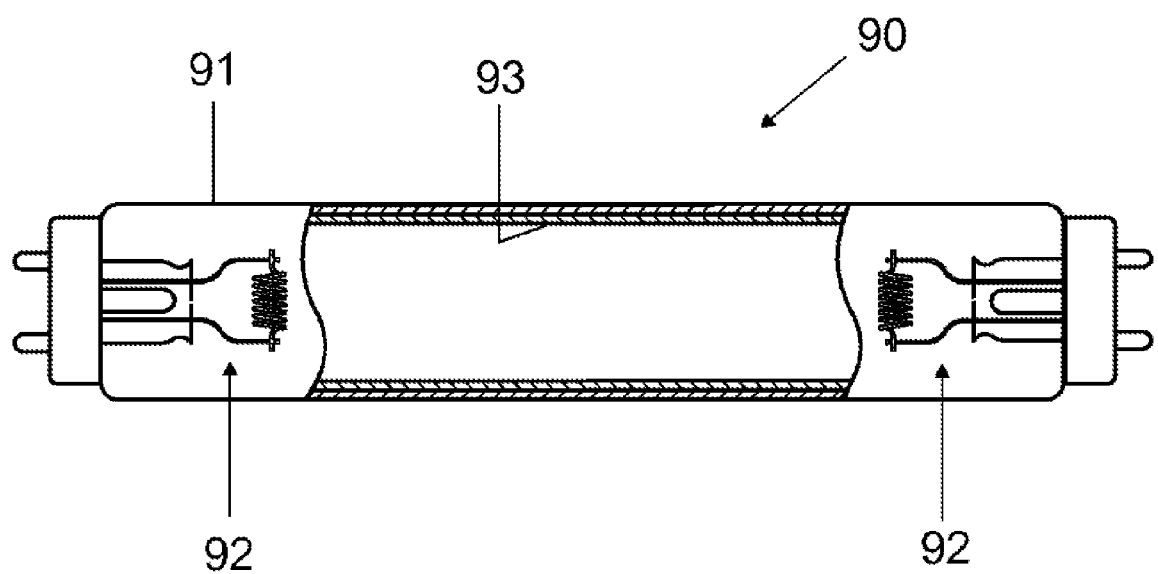
FIG. 13 shows an illustration of a lamp having luminescent substance.

FIG. 13 shows a luminescent substance lamp 90 having a bulb 91 and two electrodes 92. It contains a typical filler, which has mercury, and a luminescent substance layer 93 incorporating an NOS luminescent substance having batch stoichiometry of the formula $EA_{2-x-a}RE_xEu_aSi_{1-y}O_{4-x-2y}N_x$.

Figure 14A:
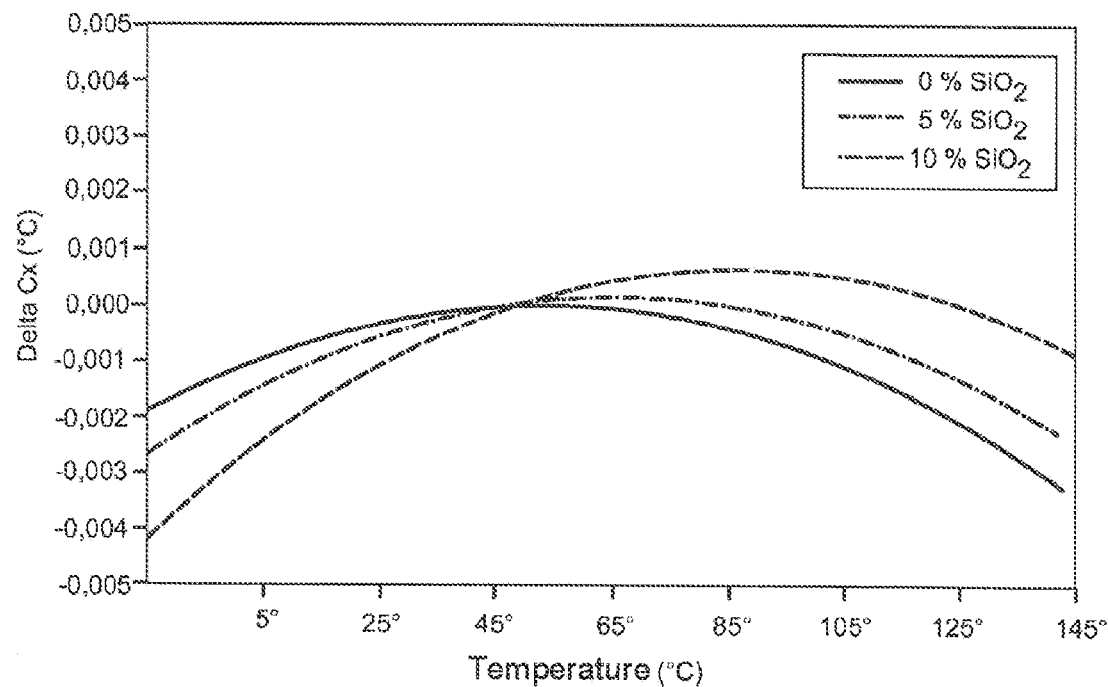
FIGS. 14A and 14B show illustrations of the influence of $SiO_2$ on the stabilization of the colorimetric locus.
Figure 14B:
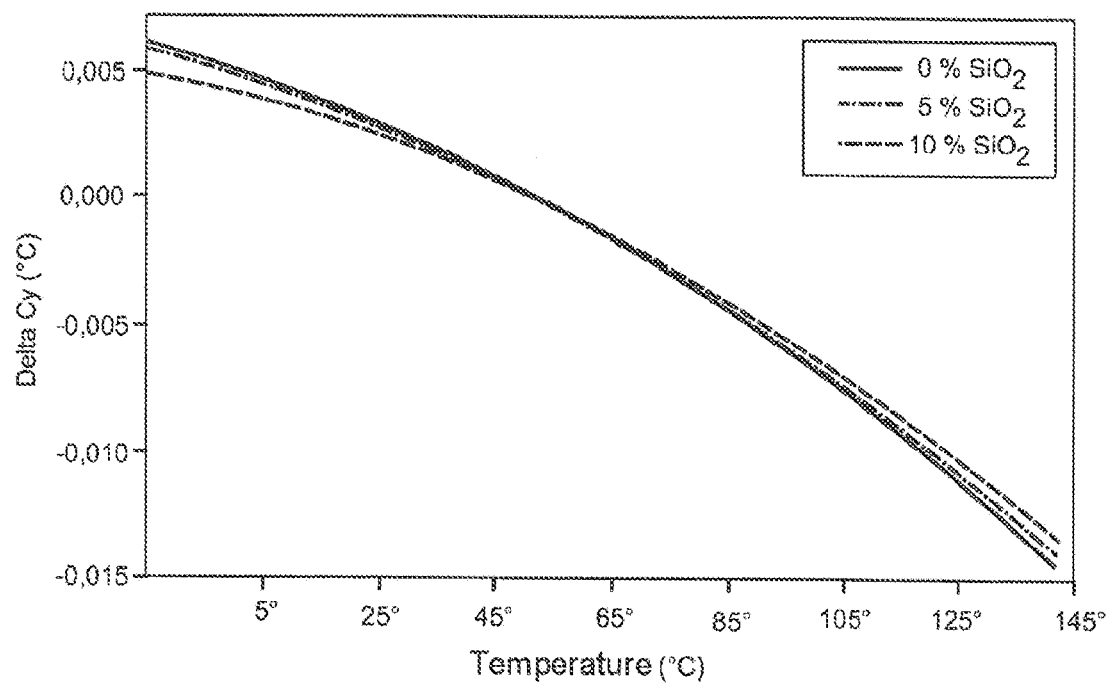

FIGS. 14A and 14B show the influence of $SiO_2$ as a filler material in the casting material on the stabilization of the colorimetric locus as a function of the temperature. At a proportion of 10 wt.-% $SiO_2$, the exemplary embodiment shown is successful in keeping the colorimetric locus shift, which relates to the x coordinate, at less than 0.001 in a temperature range from 25° C. to 145° C. The y coordinate may not be stabilized as well, however, $SiO_2$ also has a positive influence here. Above all, a proportion of $SiO_2$ in the range from 5 to 15% is recommended. Further components of the casting material are substantially silicone and luminescent substance.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A light source comprising a primary radiation source, which emits radiation in the shortwave range of the optical spectral range in the wavelength range of 420 to 480 nm, wherein this radiation is converted at least by means of a first luminescent substance entirely or partially into secondary longer-wave radiation in the visible spectral range, wherein the first luminescent substance belongs to a class of nitridic modified orthosilicates (NOS), wherein a batch stoichiometry corresponds to a formula $EA_{2-x-a}RE_xEu_aSi_{1-y}O_{4-x-2y}N_x$, wherein EA=Sr, Ba, Ca, or Mg alone or in combination, RE=La or Lu or Dy or Yb alone or in combination, x is between 0.002 and 0.02, a is between 0.01 and 0.20, $0<y\leq0.1$ and wherein the full width at half maximum (FWHM) of the NOS is at most 90 nm.

2. The light source as claimed in claim 1, wherein EA contains Sr, Ba or a mixture of Sr and Ba with at least 66 mol-%.

3. The light source as claimed in claim 2, wherein EA is a mixture of Sr and Ba with Sr/Ba=0.8 to 1.2.

4. The light source as claimed in claim 2, wherein EA is a mixture of Sr and Ba with Sr/Ba=0.9 to 1.1.

5. The light source as claimed in claim 1, wherein the primary radiation source emits a blue radiation in a wavelength range of 440 to 470 nm, wherein this radiation is partially converted by means of the first luminescent substance into secondary green radiation in the visible spectral range, having peak emission in the range of 510 to 540 nm.

6. The light source as claimed in claim 5, wherein a part of the primary radiation is converted by means of further luminescent substances into longer-wave radiation, wherein at least one of the further luminescent substances has a FWHM of at most 90 nm.

7. The light source as claimed in claim 1, wherein a second luminescent substance is arranged upstream from the primary radiation source, which emits in red and is represented by the formula AEAlSiN$_3$:Eu, where AE=Ca or Sr, alone or in combination.

8. An illumination unit for LCD backlighting, wherein a light source according to claim 1 is used together with at least one color filter,
wherein the light source and the color filter or the conversion LED and the color filter are adapted to one another such that a predefined color space is covered by at least 85% by the radiation emitted from the illumination unit, wherein the color space is in particular NTSC.

9. An illumination unit for LCD backlighting, wherein a light source according to claim 1 is used together with at least one color filter for the red spectral range having a maximum in the range of 625 to 655 nm.

10. The illumination unit for LCD backlighting as claimed in claim 9, wherein the light source or the conversion LED is used together with a color filter for the green spectral range having a maximum in the range of 515 to 535 nm.

11. The illumination unit for LCD backlighting as claimed in claim 9, wherein the light source or the conversion LED is used together with a color filter for the blue spectral range having a maximum between 435-455 nm.

12. The light source as claimed in claim 1, wherein $0.002 \leq y \leq 0.02$.

13. A conversion LED comprising a chip which emits primary radiation, and a layer containing at least one luminescent substance, which is connected upstream from the chip, and which converts at least a part of the primary radiation of the chip into secondary radiation, the at least one luminescent substance belonging to a class of nitridic modified orthosilicates (NOS), which is derived from the structure $M_2SiO_4$:D, wherein a batch stoichiometry of the luminescent substance corresponds to the formula $EA_{2-x-a}RE_xEu_aSi_{1-y}O_{4-x-2y}N_x$, wherein EA=Sr, Ba, Ca or Mg alone or in combination, RE=La or Lu or Dy or Yb alone or in combination, x is between 0.002 and 0.02, a is between 0.01 and 0.20, $0<y\leq0.1$ and wherein the full width at half maximum (FWHM) of the NOS is at most 90 nm.

14. The conversion LED as claimed in claim 13 wherein CaAlSiN$_3$:Eu is used as a further luminescent substance.

15. The conversion LED as claimed in claim 13, wherein the layer containing the luminescent substance is cast resin, silicone, or glass.

16. The conversion LED as claimed in claim 13 wherein the layer containing the luminescent substance is cast resin, wherein SiO$_2$ is used as a filler.

17. An illumination unit for LCD backlighting, wherein a conversion LED according to claim 13 is used together with at least one color filter for the red spectral range having a maximum in the range of 625 to 655 nm.

18. An illumination unit for LCD backlighting, wherein a conversion LED according to claim 13 is used together with at least one color filter, wherein the light source and the color filter or the conversion LED and the color filter are adapted to one another such that a predefined color space is covered by at least 85% by the radiation emitted from the illumination unit, wherein the color space is in particular NTSC.

* * * * *